(12) United States Patent
Chen

(10) Patent No.: US 9,293,201 B2
(45) Date of Patent: Mar. 22, 2016

(54) HETEROJUNCTION OXIDE NON-VOLATILE MEMORY DEVICES

(71) Applicant: 4DS, Inc., Fremont, CA (US)

(72) Inventor: Dongmin Chen, Fremont, CA (US)

(73) Assignee: 4D-S PTY, LTD, Perth (AU)

( * ) Notice: Subject to any disclaimer, the term of this patent is extended or adjusted under 35 U.S.C. 154(b) by 0 days.

(21) Appl. No.: 14/186,273

(22) Filed: Feb. 21, 2014

(65) Prior Publication Data

US 2014/0169070 A1    Jun. 19, 2014

Related U.S. Application Data

(63) Continuation of application No. 13/396,404, filed on Feb. 14, 2012, now Pat. No. 8,698,120, which is a continuation of application No. PCT/US2010/045667, filed on Aug. 16, 2010.

(60) Provisional application No. 61/234,183, filed on Aug. 14, 2009.

(51) Int. Cl.
     *G11C 13/00*      (2006.01)
     *G11C 11/56*      (2006.01)
     (Continued)

(52) U.S. Cl.
     CPC ........ *G11C 13/0023* (2013.01); *G11C 11/5685* (2013.01); *G11C 13/0002* (2013.01); *G11C 13/0007* (2013.01); *H01L 45/08* (2013.01); *H01L 45/1233* (2013.01); *H01L 45/146* (2013.01); *H01L 45/147* (2013.01); *H01L 45/1625* (2013.01); *H01L 45/1633* (2013.01);

(Continued)

(58) Field of Classification Search
     CPC ........... G11C 13/0023; G11C 11/5685; H11C 13/0002; H01L 45/146; H01L 45/147; H01L 45/08; H01L 45/1233; H01L 45/1633; H01L 27/2463
     USPC ............................................................ 257/4
See application file for complete search history.

(56) References Cited

U.S. PATENT DOCUMENTS

| 6,373,743 B1 | 4/2002 | Chen et al. |
| 6,965,137 B2 | 11/2005 | Kinney et al. |
| 7,071,008 B2 | 7/2006 | Rinerson et al. |

(Continued)

FOREIGN PATENT DOCUMENTS

| JP | 2006108645 A | 4/2006 |
| JP | 2008098537 A | 4/2008 |

(Continued)

OTHER PUBLICATIONS

Advisory Action of Oct. 30, 2013 for U.S. Appl. No. 13/396,404, 2 pages.

(Continued)

*Primary Examiner* — William D Coleman
(74) *Attorney, Agent, or Firm* — Kilpatrick Townsend & Stockton LLP

(57) ABSTRACT

A memory device includes a first metal layer and a first metal oxide layer coupled to the first metal layer. The memory device includes a second metal oxide layer coupled to the first metal oxide layer and a second metal layer coupled to the second metal oxide layer. The formation of the first metal oxide layer has a Gibbs free energy that is lower than the Gibbs free energy for the formation of the second metal oxide layer.

12 Claims, 18 Drawing Sheets

(51) Int. Cl.
   *H01L 45/00* (2006.01)
   *H01L 27/24* (2006.01)

(52) U.S. Cl.
   CPC ......... *G11C 2213/77* (2013.01); *H01L 27/2463* (2013.01)

(56) References Cited

U.S. PATENT DOCUMENTS

| | | |
|---|---|---|
| 7,254,059 B2 | 8/2007 | Li et al. |
| 7,544,966 B2 | 6/2009 | Yang et al. |
| 7,666,526 B2 | 2/2010 | Chen et al. |
| 8,054,674 B2 | 11/2011 | Tamai et al. |
| 8,178,875 B2 | 5/2012 | Kiyotoshi |
| 8,188,466 B2 | 5/2012 | Kawano et al. |
| 2003/0151941 A1 | 8/2003 | Salling |
| 2004/0159869 A1 | 8/2004 | Rinerson et al. |
| 2004/0188742 A1 | 9/2004 | Honma et al. |
| 2005/0245039 A1 | 11/2005 | Li et al. |
| 2007/0008768 A1 | 1/2007 | Daley |
| 2007/0215910 A1 | 9/2007 | Sutardja et al. |
| 2007/0269683 A1 | 11/2007 | Chen et al. |
| 2008/0106925 A1 | 5/2008 | Paz de Araujo et al. |
| 2008/0106926 A1 | 5/2008 | Brubaker et al. |
| 2009/0026434 A1 | 1/2009 | Malhotra et al. |
| 2010/0321991 A1 | 12/2010 | Kostylev et al. |
| 2011/0006275 A1 | 1/2011 | Roelofs et al. |
| 2011/0149634 A1 | 6/2011 | Schloss et al. |
| 2012/0126195 A1 | 5/2012 | Ignatiev et al. |
| 2012/0205611 A1 | 8/2012 | Chen |
| 2012/0314468 A1 | 12/2012 | Siau et al. |

FOREIGN PATENT DOCUMENTS

| | | |
|---|---|---|
| JP | 200830615 A | 12/2008 |
| WO | 2011020122 A1 | 2/2011 |
| WO | 2011123465 A1 | 10/2011 |

OTHER PUBLICATIONS

English Translation of Notice of Rejection issued in Japanese Application No. 2012-507481 on Jul. 31, 2013, 3 pages.
English Translation of Official Action issued in Korean Application No. 10-2011-7023456 on Sep. 4, 2013, 2 pages.
English Translation of Office Action of Chinese Patent Application No. 201080015470.5, mailed Apr. 24, 2013, 6 pages.
Extended European Search Report issued in European Application No. 10808880.8, on Jun. 6, 2013, 5 pages.
Final Office Action of Feb. 14, 2013 for U.S. Appl. No. 13/446,981, 15 pages.
Final Office Action of Jul. 11, 2013 for U.S. Appl. No. 13/396404, 22 pages.
International Search Report and Written Opinion of the International Authority for PCT Application No. PCT/2011/030382, mailed on May 25, 2011.
International Search Report and Written Opinion of the International Authority for PCT Application No. PCT/US2010/45667, mailed on Nov. 26, 2010, 10 pages.
Kawano et al., "Enhancement of Switching Capability on Bipolar Resistance Switching Device with Ta/Pr0.7Ca0.3MnO3/Pt Structure", 2008, Applied Physics Express 1, pp. 1-3.
Liao et al. "Categorization of resistive switching of metal-PR.sub.0.7Ca.sub.0.3MnO.sub3-metal devices." App. Phys. Lett., vol. 94, 253503, Jun. 24, 2009, pp. 1-3.
Non-Final Office Action of Dec. 12, 2012 for U.S. Appl. No. 13/396,404, 19 pages.
Non-Final Office Action of Jun. 26, 2012, for U.S. Appl. No. 13/456,378; 8 pages.
Non-Final Office Action of Oct. 3, 2012 for U.S. Appl. No. 13/446,981, 11 pages.
Non-Final Office Action of Oct. 12, 2012 for U.S. Appl. No. 13/456,378, 8 pages.
Notice of Allowance of Dec. 14, 2012 for U.S. Appl. No. 13/456,378, 8 pages.
Notice of Allowance of Nov. 27, 2013 for U.S. Appl. No. 13/396,404, 9 pages.
Notice of Allowance of Dec. 13, 2013 for U.S. Appl. No. 13/446,981, 11 pages.
Watanabe, "Epitaxial all-perovskite ferroelectric field effect transistor with a memory retention." App. Phys. Lett., vol. 66, Issue 14, Apr. 3, 1995.
Chen, A., "Electronic Effect Resistive Switching Memories", *2010 ITRS Emerging Memory Workshop White Paper*, 2010, pp. 1-20.
Non-Final Office Action dated Aug. 29, 2014, for U.S. Appl. No. 13/841,147, 15 pages.
Final Office Action dated Jan. 22, 2015, for U.S. Appl. No. 13/841,147, 13 pages.
Non-Final Office Action dated Aug. 14, 2015, for U.S. Appl. No. 13/841,147, 17 pages.

Figure 4

Classification of PCMO devices

| | Oxidation Gibbs Free Energy | Device Structure |
|---|---|---|
| Type - I | > PCMO | M/PCMO/M |
| Type - II | < PCMO | M/MO/PCMO/M |

Figure 6

Characteristics of PCMO devices

|  | TYPE-I | TYPE-II |
|---|---|---|
| ΔR | Small | Large |
| Response time | fast | fast |
| Retention | Good | Excellent |
| Endurance | Good | Good |
| Tunable | Poor | Excellent |

Back-to-back switching resistor

Figure 10 Tri-state of back-to-back switching resistor device

Identify the Tri-state
10 state vs. 01 state (destructive read, need to reinstall the state after read)

HETEROJUNCTION OXIDE NON-VOLATILE MEMORY DEVICES

CROSS REFERENCE TO RELATED APPLICATIONS

This application claims priority to and is a continuation U.S. application Ser. No. 13/396,404 filed on Feb. 14, 2012, which in turn is a continuation of International Patent Application No. PCT/US2010/045667, filed on Aug. 16, 2010, which claims priority to U.S. Provisional Patent Application No. 61/234,183, filed on Aug. 14, 2009. This application is related to U.S. Pat. No. 8,378,345, which is also a continuation of U.S. application Ser. No. 13/396,404 filed on Feb. 14, 2012. The disclosures of all of the above-mentioned applications are incorporated by reference herein in their entirety for all purposes.

FIELD OF INVENTION

The present invention relates generally to memory devices, and more particularly to a memory device that includes hetero junction oxide material.

BACKGROUND OF THE INVENTION

As Moore's Law has been predicting, the capacity of memory cells on silicon for the past 15-20 years has effectively doubled each year. Moore's Law is that every year the amount of structures or gates on a silicon wafer will double, but the price will essentially stay the same. And in some cases, the price will even erode. As these memory cells continue to shrink, the technology is starting to reach a barrier know as the quantum limit, that is, they are actually approaching molecular boundaries, so the cells cannot get any smaller.

Disk drives have been the dominant prime storage in terms of peak capacity, because storing individual domains (magnetic transition sites) on the disk drives unlike semiconductor memory cells disk memory sites do not require connections to get in and out of those domains. Now, in recently history, semiconductor resolutions apply feature geometries with 90 nanometer feature resolutions progressing to 45 and 25 nanometer feature size sizes, with these feature capabilities, the memory cell size and chip capacity equation changes, furthermore, certain semiconductor memory technologies have applied a principal of geometric redundancy, where a multiple of data bits may be stored in a single cell. This property of a memory cell to support a multiple of values is sometimes referred to as its dynamic range. To date the for memory cells have abilities to support a dynamic range anywhere between 1 and 4 bits, gives you multiples of storage per memory cell. These combined properties of semiconductors, have increased capacities and costs to now directly compete with disk drives.

Another issue associated with semiconductor memory manufacturing has been the substantial costs of the semiconductor foundries which can run up to more than a billion dollars to establish with amortizing expenses inflating the unit cost of memory chips. In recent history this represented price barriers compared with cost per capacity of a disk drive file. Now, with advances in foundry resolutions enabling smaller cell sizes and the geometric redundancy of multiple bit-level per memory cell semiconductor memory is actually cheaper per unit cost, and substantially more rugged in terms of high G forces than memory files on a disk drive.

In Flash memories, there have been improvements in the Moore's Law effect but that has become a diminishing proposition because as the cells started getting smaller and smaller, write cycle limitations and ability to support dynamic ranges are diminished.

So basically, as characterized in recent press review, Flash memory has hit the proverbial wall in increasing data capacity per unit cost, as the quantum limit is approached.

But another issue with Flash memory is its limitations in write speeds. In order to compete with disk drive performance, the memory cells word structure is configured to switch in parallel. Another issue is the number of write cycle limitations the cell will tolerate before it permanently fails. Prior to the substantial reduction in cell size, it was approximately in the range of one million, however, as the foundry feature size resolutions reduced in size, rewrite cycle diminished to approximately 100,000 write cycles. For most non-prime storage applications that may be practical. However, for SRAM and DRAM applications where you're actually exchanging data at substantial repetition rates, several times per microsecond.

Accordingly, what is desired is a memory system and method which overcomes the above-identified problems. The system and method should be easily implemented, cost effective and adaptable to existing storage applications. The present invention addresses such a need.

SUMMARY OF THE INVENTION

A memory device is disclosed. The memory device comprises a first metal layer and a first metal oxide layer coupled to the first metal layer. The memory device includes a second metal oxide layer coupled to the first metal oxide layer and a second metal layer coupled to the second metal oxide layer. The formation of the first metal oxide layer has a Gibbs free energy that is lower than the Gibbs free energy for the formation of the second metal oxide layer.

BRIEF DESCRIPTION OF THE DRAWINGS

FIG. 4 illustrates the classification of PCMO devices in accordance with embodiments of the present invention.

FIG. 6 illustrates the characteristics of the PCMO devices of FIG. 5.

DETAILED DESCRIPTION OF SPECIFIC EMBODIMENTS

The present invention relates generally to memory devices, and more particularly to a memory device that includes a heterojunction oxide material. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The present invention is directed to a memory device. The memory device can be utilized in a variety of applications from a free standing nonvolatile memory to an embedded device in a variety of applications. These applications include but are not limited to embedded memory used in a wide range of SOC (system on chip), switches in programmable or configurable ASIC, solid state drive used in computers and servers, memory sticks used in mobile electronics like camera, cell phone, iPod® etc. The memory device comprises a first metal layer and a first metal oxide layer coupled to the first metal layer. The memory device includes a second metal oxide layer coupled to the first metal oxide layer and a second metal layer coupled to the second metal oxide layer. These metal and metal oxide layers can be of a variety of types and their use will be within the spirit and scope of the present invention. More particularly, many of the embodiments disclosed herein will include PCMO as one of the metal oxide layers. It is well understood by one of ordinary skill in the art that the present invention should not be limited to this metal oxide layer or any other layer disclosed herein. The key element is that the formation of the first metal oxide layer has a Gibbs free energy that is lower than the Gibbs free energy for the formation of the second metal oxide layer.

Figure 1A:
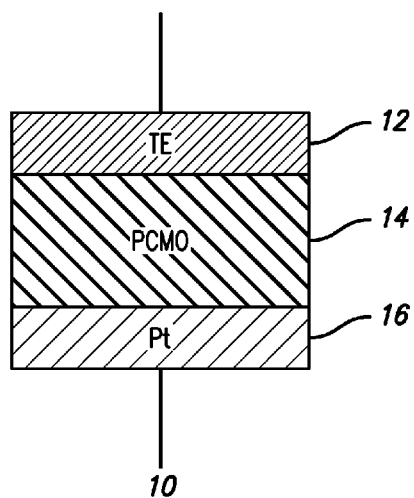
FIGS. 1A & 1B illustrate a memory device in accordance with an embodiment.
Figure 1B:
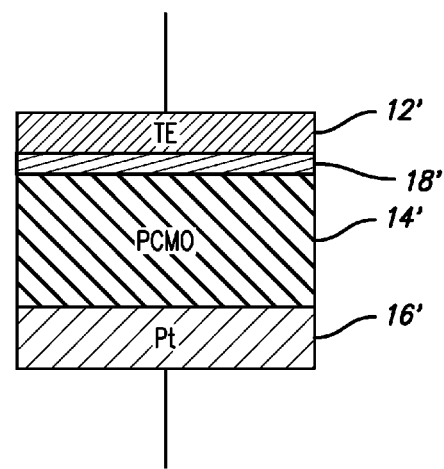

FIG. 1A is an illustration of a memory device 10 which includes a Platinum (Pt) bottom electrode 16, which in turn is coupled to a Praseodymium Calcium Manganese Oxide (PCMO) layer 14 which in turn is coupled to a top electrode 12 which is made of a metal. If a Gibbs free energy for the formation of oxidation of the top electrode 12 is less (more negative) than a Gibbs free energy for the formation of oxidation of the PCMO layer 14, the top electrode metal 12 will spontaneously form a thin metal oxide 18 at the interface as shown in FIG. 1B. The first metal oxide layer is preferably thinner than the second oxide layer. In an embodiment, the second metal oxide layer (in this case PCMO) is twenty to fifty times thicker than the first metal oxide layer. For example, the thickness of the first metal oxide layer is in the range often to fifty angstroms, and the thickness of the PCMO is 500 to 1000 angstroms.

Figure 2:
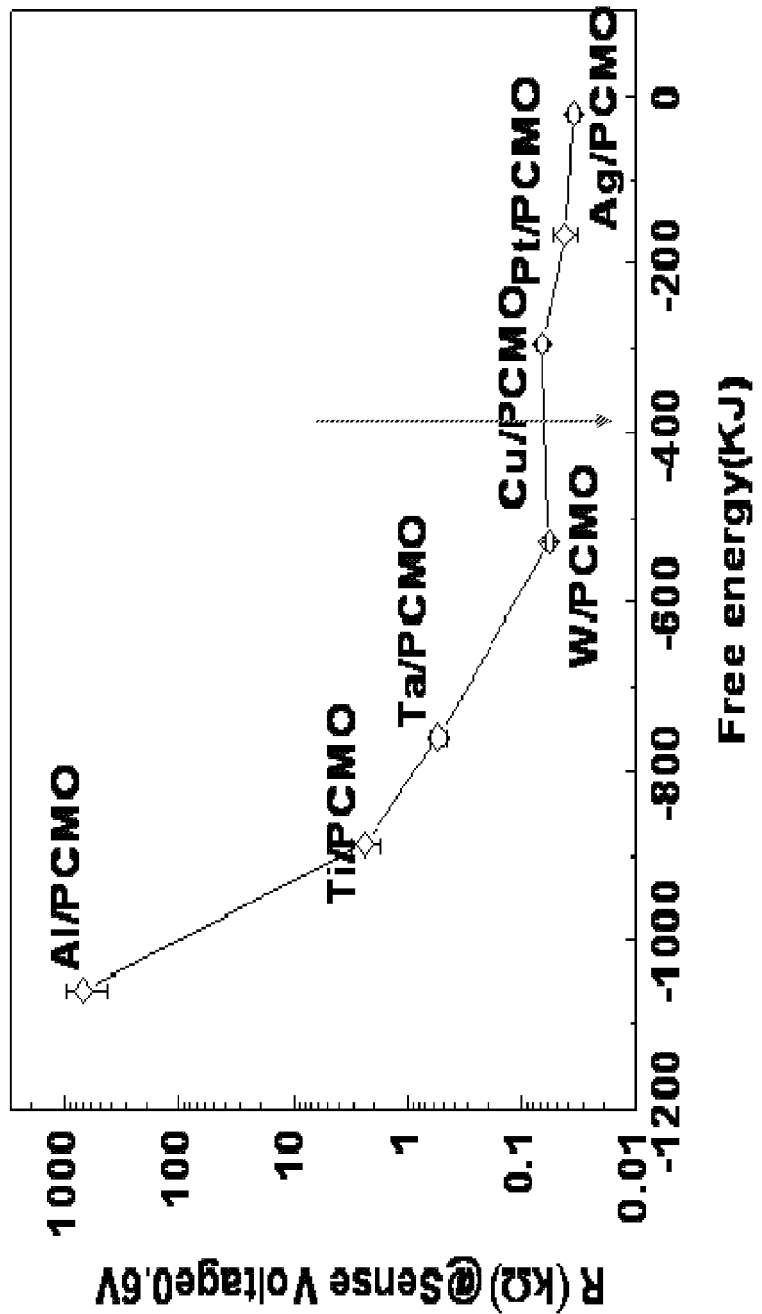
FIG. 2 is a graph showing resistance versus the Gibbs free energy for various metals.
Figure 3:
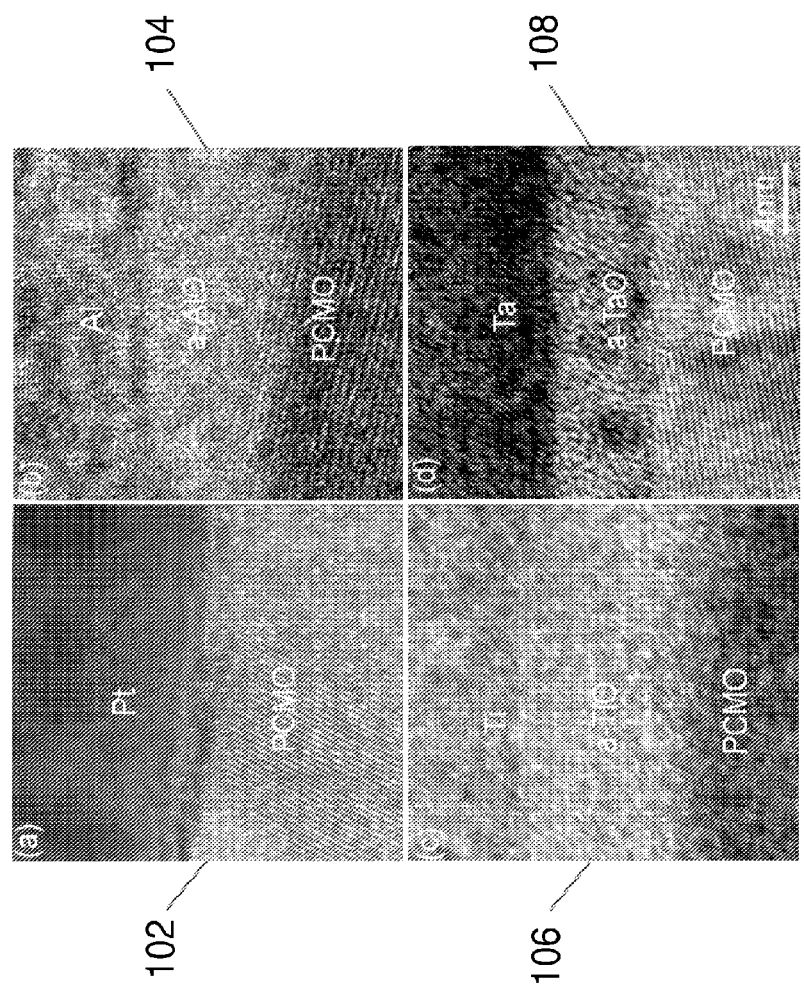
FIG. 3 illustrates a set of transmission electron micrographs (TEM's) that show the cross sections of formation of (or no formation of) metal oxide at the junction of two types of interfaces according to an embodiment of the present invention.

Referring now to FIG. 2, what is shown is a graph showing resistance versus the Gibbs free energy free energy for various top metals coupled to PCMO, which is in turn coupled to a Pt bottom electrode. As is seen, elements such as gold, silver, and platinum, which have a higher oxidation Gibbs free energy than PCMO, will not spontaneously form oxide at the contact with the PCMO. However aluminum, titanium, and tantalum, have a lower oxidation Gibbs free energy (more negative) than PCMO which allows for a spontaneously forming metal oxide upon contact there between. FIG. 3 is a set of transmission electron micrographs that show the cross sections of formation of (or no formation of) metal oxide at of these two types of interfaces. As is seen in electron micrograph 102 which shows an interface between Platinum and PCMO there is no formation of a metal oxide. Electron micrographs 104-106 all illustrate the formation of a metal oxide when aluminum, titanium and tantalum respectively are interfaced with PCMO.

FIG. 4 shows a method to classify various as-made "metal-PCMO-metal" devices into two types based on the relative value of the oxidation Gibbs free energy of the metal with relative to the oxidation Gibbs free energy of PCMO. For Type-I devices, both the top and bottom metal electrode have a higher oxidation Gibbs free energy than the oxidation free energy of PCMO. The device structure is metal-PCMO-metal or M/PCMO/M. For Type-II devices, one of the metal electrode (top electrode) has a lower oxidation Gibbs free energy than the Gibbs free energy of PCMO. Due the spontaneous formation of the metal oxide at the contact with PCMO, the true device structure becomes metal-metal oxide-PCMO-metal, or M/MO/PCMO/M. Thus, a Type-II device is a hetero junction metal oxide device. The above rule of using the relative values of the oxidation free energy with respect to a base metal-oxide material can be generalized to any metal oxide. For example, Al, Ta and Ti can form Type-II device with a Tungsten Oxide which is coupled to Pt, Au or Ag as indicated in FIG. 2.

Figure 5:
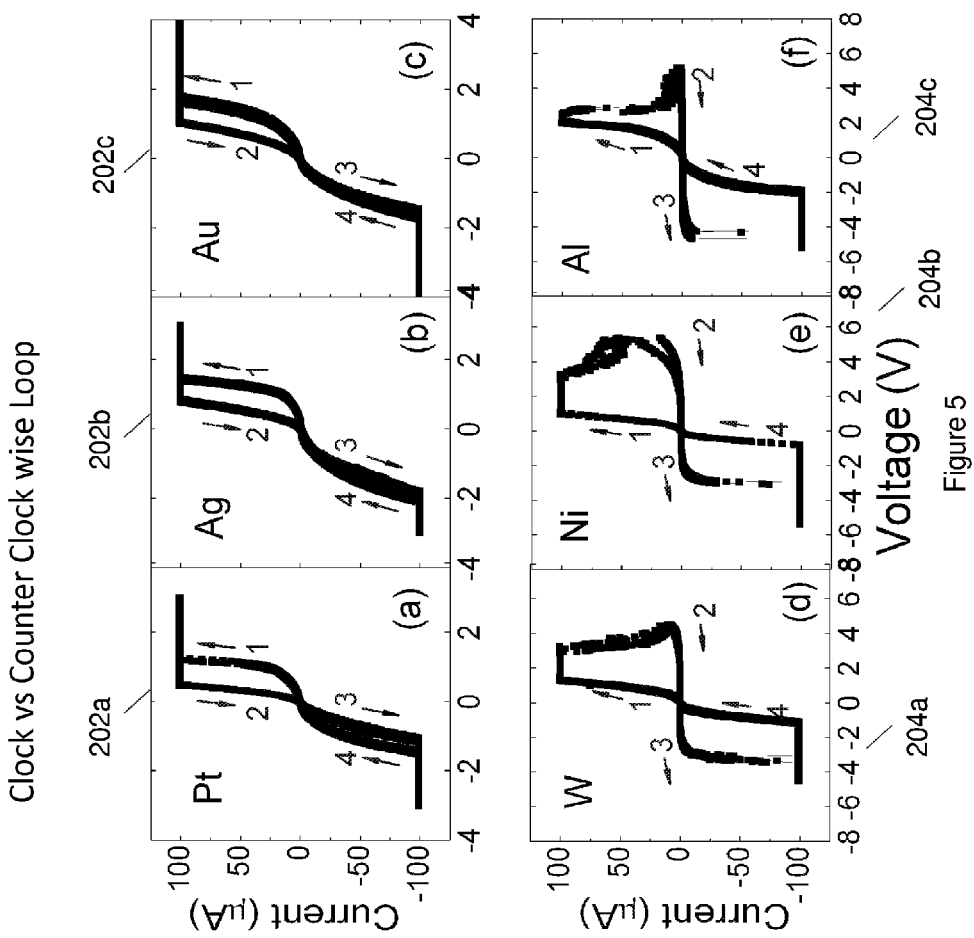
FIG. 5 is a graph showing hysteresis loops for two types of memory devices according to an embodiment of the present invention.

FIG. 5 shows that the above Type-I and Type-II devices yield different current-voltage (I-V) hysteresis curves. A Type-I device (202a, 202b and 202c) yields a counter clock wise (CCW) hysteresis loop, while a Type-II device (204a, 204b and 204c) yields a clock wise hysteresis loop. Furthermore, the hysteresis loop of the Type-II device is considerably larger than the hysteresis loop of Type-I devices. The CCW loop and CW loop will be swapped if the polarity of the bias is interchanged. These unique I-V characteristics can be utilized for various applications.

The different hysteresis loops imply that both PCMO and metal-oxide are switchable resistors and a voltage with the correct polarity and amplitude can cause the resistor to switch from a low resistive state (LRS) to a high resistive state (HRS) (RESET), or from a HRS to a LRS (SET). Typically, the lower oxidation Gibbs free energy will result in a more stable oxide structure which has a much higher resistance in HRS than the resistance of PCMO in HRS. The metal oxide layer is much thinner than PCMO and its resistance at LRS is comparable to the resistance of PCMO at HRS. This feature is quite important. When the metal oxide is in HRS, most of the voltage applied to the Type-II device will drop across the metal oxide and hence create a high internal field that causes the switching from HRS to LRS (SET). On the other hand, when the metal oxide is in LRS, the voltage apply to the Type-II device will be shared in metal-oxide and in PCMO and hence allow field induced oxygen ion migrations in these metal oxide layers.

These concepts are used to advantage to provide a heterojunction nonvolatile memory device which can retain data over a significant period of time. FIG. 6 illustrates the characteristics of each of these types of devices. As is seen although both types can be utilized as memory devices the Type-II device is more effective and has better characteristics. The key element is that the formation of the first metal oxide layer has a Gibbs free energy that is lower than the Gibbs free energy for the formation of the second metal oxide layer. In so doing the two metal oxide layers provide a heterojunction that allows for the continual setting and resting of the device.

Figure 7A:
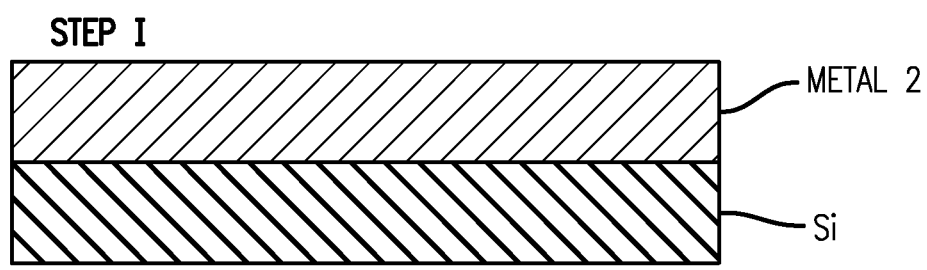
FIG. 7A illustrates providing the metal2 on a silicon surface.
Figure 7B:
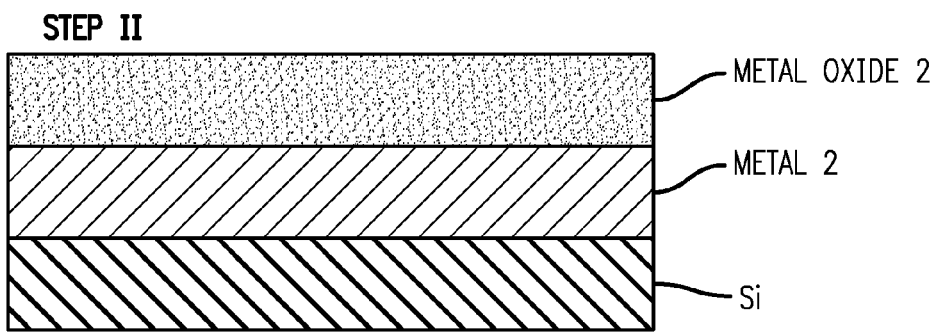
FIG. 7B illustrates sputtering metal2 oxide onto the metal2 surface.
Figure 7C:
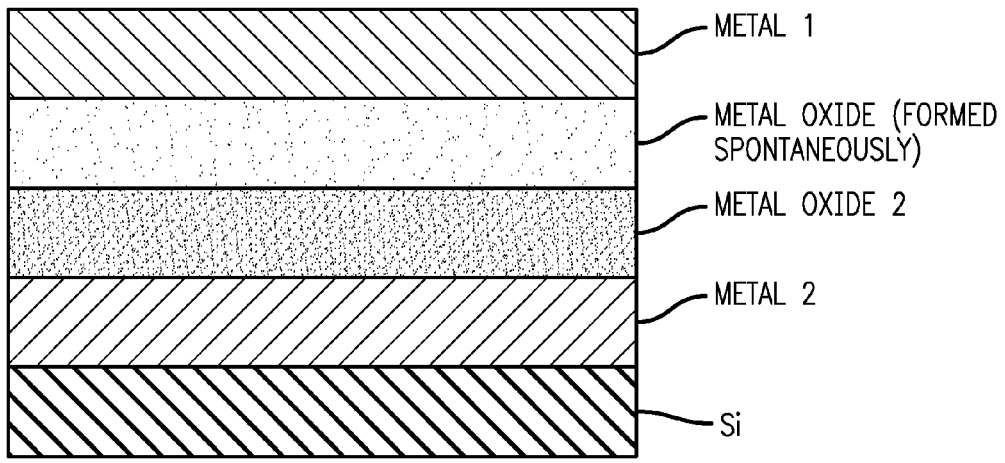
FIG. 7C illustrates metal oxide 1 forming spontaneously by providing metal1 of the right energy level on the metal 2 oxide.
Figure 7D:
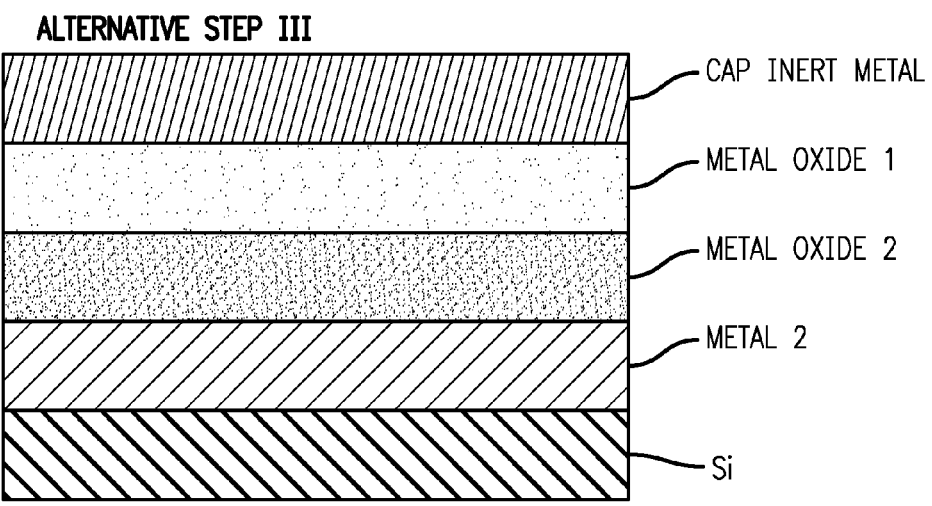
FIG. 7D illustrates the metal oxide 1 sputtered on to the metal oxide 2 surface, and an inert metal is provided on top of the metal 2 oxide.

FIG. 7A-7D illustrates the process of producing such a device. FIG. 7A illustrates providing the metal2 on a silicon surface. FIG. 7B illustrates sputtering metal oxide 2 onto the metal 2 surface. The next step is one of two alternative processes. Firstly, as seen in FIG. 7C, metal oxide 1 is formed spontaneously by providing metal 1 on the metal oxide 2, where the metal-1 has a lower oxidation free energy than that of metal 2 so that metal oxide 1 can be form spontaneously between metal 1 and metal oxide 2. As an alternative as shown in FIG. 7D the metal oxide 1 is sputtered on to the metal oxide 2 surface, and an inert metal is provided on top of the metal 1 oxide. Through the use of this system, a heterojunction oxide non-memory device can be provided that has characteristics that are significantly better than existing devices.

The heterojunction switchable resistor can be used to construct high density memory array. Since it is a bipolar device, in general, it requires a transistor circuit to address (select, set, reset and read) individual device as in many prior arts. In a system in accordance with the present invention, back to back resistive devices are utilized to eliminate the need of the transistor circuit. This type of memory system will use less power, and fewer processing steps than conventional memory systems. More importantly it allows an easy way for form a multi stack memory cell that further improves the cell density per unit source area.

Figure 8:
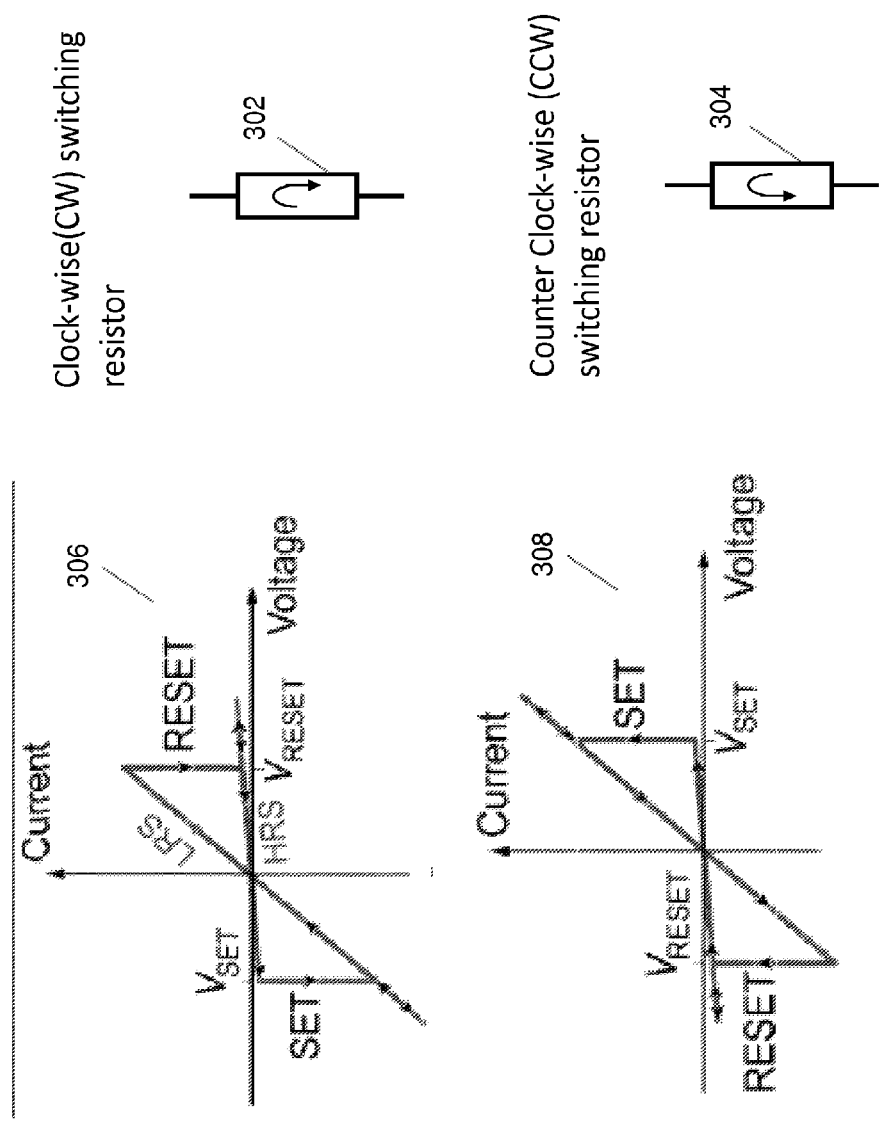
FIG. 8 illustrates the operation of a switchable resistor that has a clockwise hysteresis of current versus voltage and a switchable resistor that has a counter clockwise hysteresis of current to voltage.
}

FIG. 8 illustrates a switchable resistor 302 that has an idealized clockwise hysteresis of current versus voltage (I-V) 306 and a switchable resistor 304 that has an idealized counter clockwise I-V hysteresis 308. CW and CCW switching resistors 302 and 304 can be Type-II and Type-I device shown in FIG. 5 by the choice of the top metal electrode. They can also be constructed by using the same type device with top and bottom electrode reversed. In the FIG. 8 we use the idealized I-V characteristics to illustrate an embodiment of a switching resistor device. It is clear to hysteresis one of ordinary skill in the art that a real device will have I-V curve that differs from the ideal ones used here. However, the principle remains valid even with a real device I-V.

Figure 9:
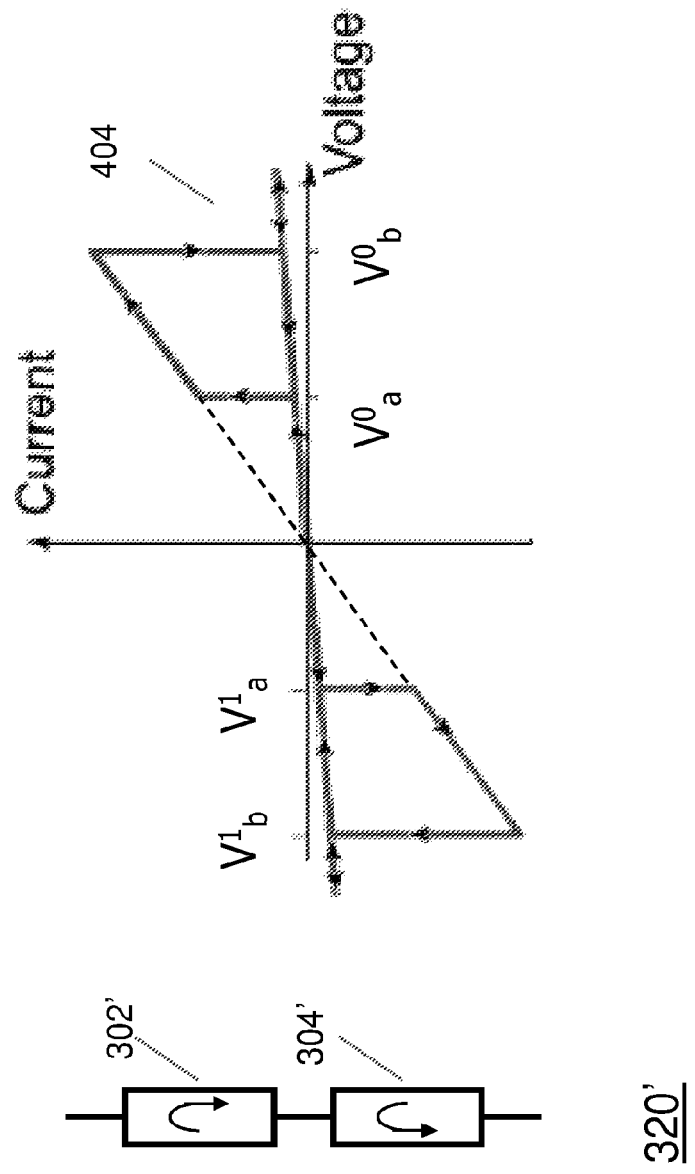
FIG. 9 is a diagram of a back to back switching resistor in accordance with an embodiment.

FIG. 9 is a diagram of a back to back switching device 320 in accordance with an embodiment, and the I-V characteristics of such a combined device. These two resistors 302' and 304' have identical idealized I-V characteristics but with opposite polarities. The I-V characteristic is due to the fact that when one resistor is switching from HRS to LRS, the other resistor is switching from LRS to HRS. By using a switching voltage between the threshold voltages Va and Vb (with in positive side or negative side), both resistors 302 and 304 can be switched into LRS.

Figure 10:
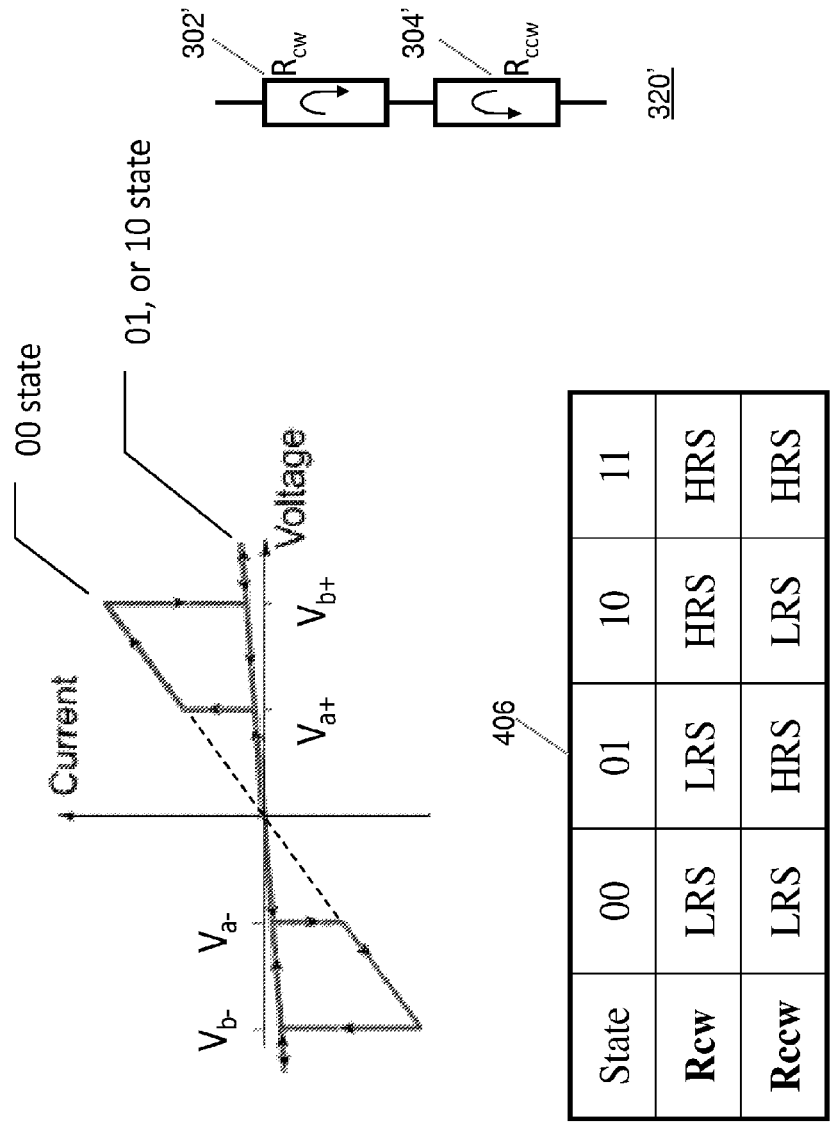
FIG. 10 is a diagram of the operation a tri-state back-to-back switching resistor device.
Figure 11:
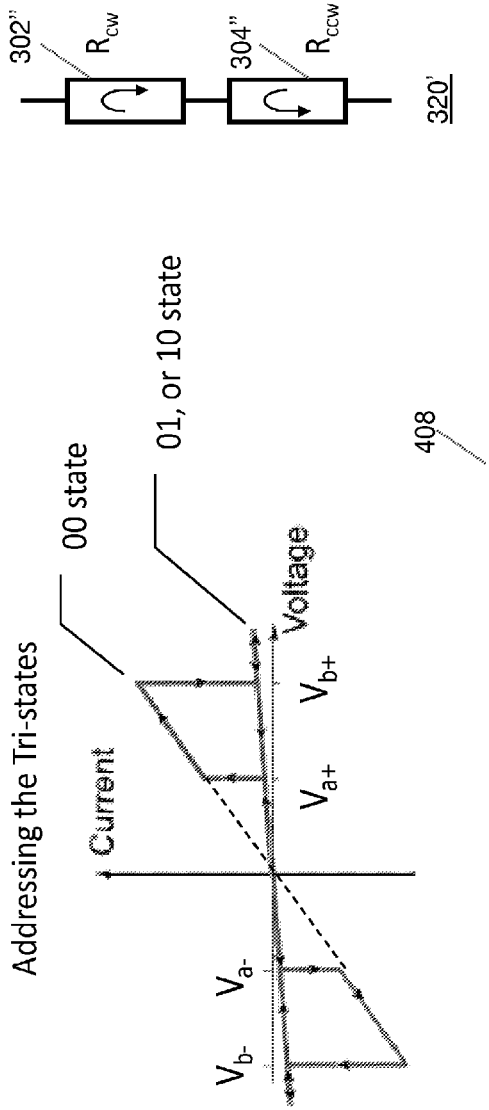
FIG. 11 illustrates first method for addressing the tri-states of the back to back switching device of FIG. 10.
Figure 12:
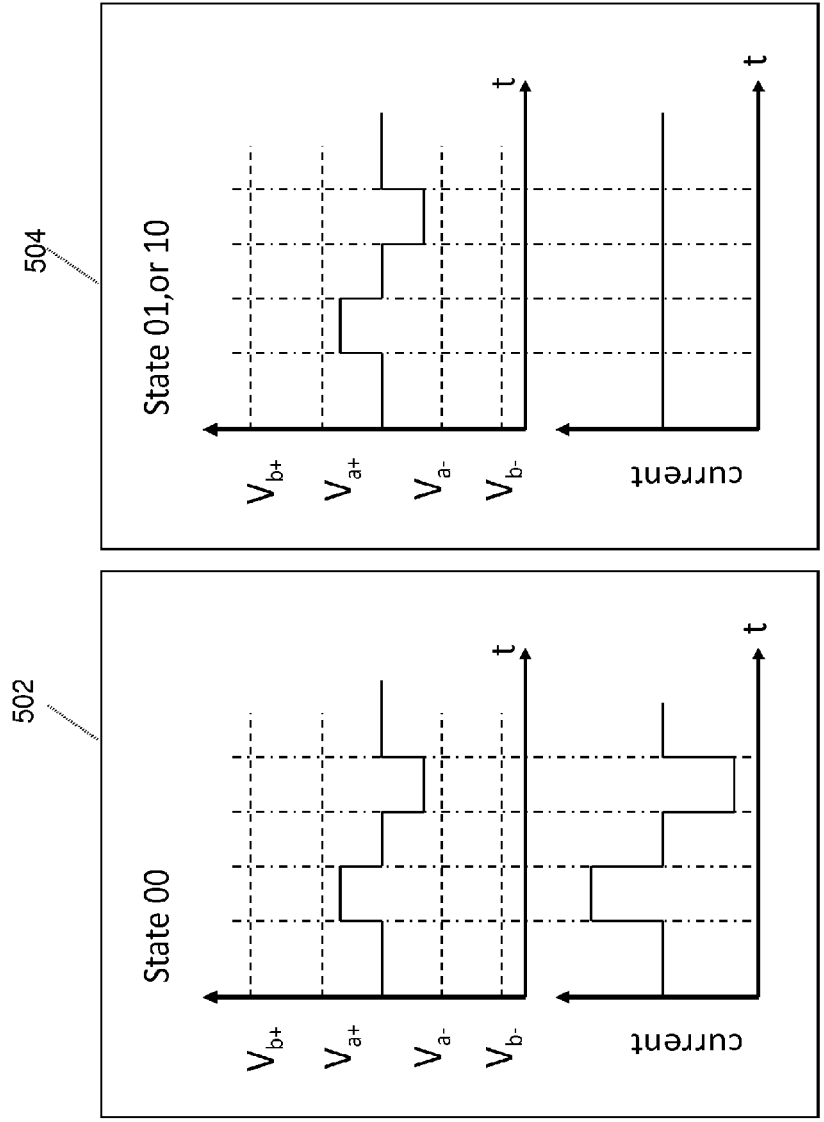
FIG. 12 is a diagram illustrating identifying the 00 state vs. 01, 10 state (nondestructive read).

FIG. 10 shows that back-to-back switching device 320' can give rise to a tri-state. When either resistor 302' or 304' is in HRS, the device 320 is in HRS. So there are two HRS, 01 or 10 state. When both resistors are in LRS, the device is in LRS, or 00 state. The table 408 in FIG. 11 illustrates a method for addressing the tri-states of the back to back switching device 320 of FIG. 10. In general, 00 state can be set to 01 or 10 state and vise versa. FIG. 12 is a diagram illustrating a method to identify the 00 state 502 vs. 01, 10 state 504. Here the read voltage is within the two lower threshold voltage (Va−<V<Va+), therefore the device will remain in the original state. This is a nondestructive read.

Figure 13:
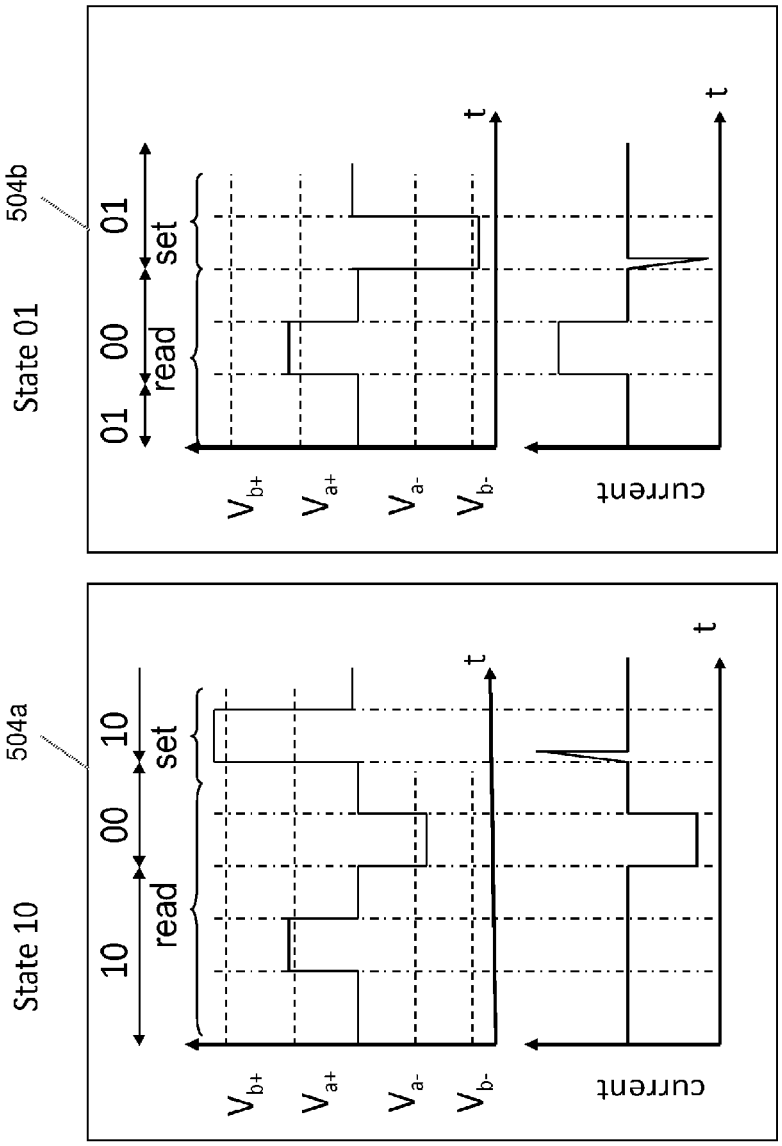
FIG. 13 is a diagram illustrating identifying a 10 state vs. 01 state (destructive read, need to reinstall the state after read).

The nondestructive read can only differentiate the 00 state (LRS) from either the 01 or 10 state (HRS state). To further differentiate 01 vs. 10 state, the polarity of the switching voltage (Vb−<V<Va− or Va+<V<Vb+) needs to be tested that cause the switching of HRS resistor to LRS. Since this is a destructive read, an additional pulse is needed to reset the device to the initial state before the destructive read. FIG. 13 is a diagram illustrating a method for identifying a 10 state vs. a 01 state. It is readily apparent to one of ordinary skill in the art that many other voltage pulses and sequences can be generated to read the tri-state.

The addressable and readable tri-state of a back-to-back switching resistor device can be used to create a memory array that avoid the need of an active transistor circuit to perform the select and set/reset and read. For example, since 01 and 10 states are two addressable and distinguishable HRS, they can be assigned to be the 0 or 1 state of a memory cell. Since both 0 and 1 state have high resistance, the system should have very low leakage current. A positive or negative voltage greater than Vb+ or smaller than Vb− can set the device to 1 or rest the device to 0 state as shown in the table for FIG. 11. For read operation, perform a test pulse to set the cell to 00 state and from the polarity of the bias to extract the 10 or 01 state. Note that the original state needs to be reinstalled after the read operation.

Figure 14:
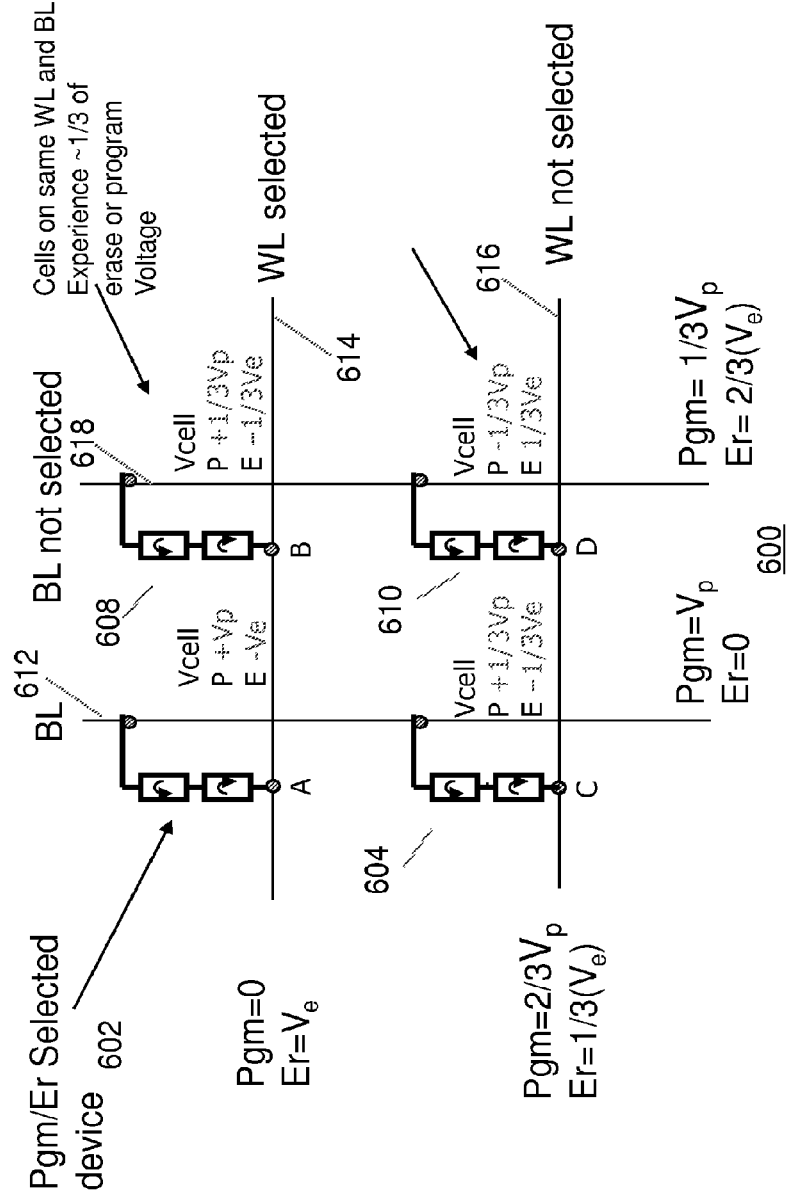
FIG. 14 illustrates addressing single cell of an array in accordance with an embodiment.

In order to address a particular memory cell, proper voltage on the read and write line are required so that the state of other cells in the memory array are not affect. FIG. 14 illustrates a diagram of biasing patterns that can fulfill this requirement when addressing single cell of an array in accordance with an embodiment.

Figure 15:
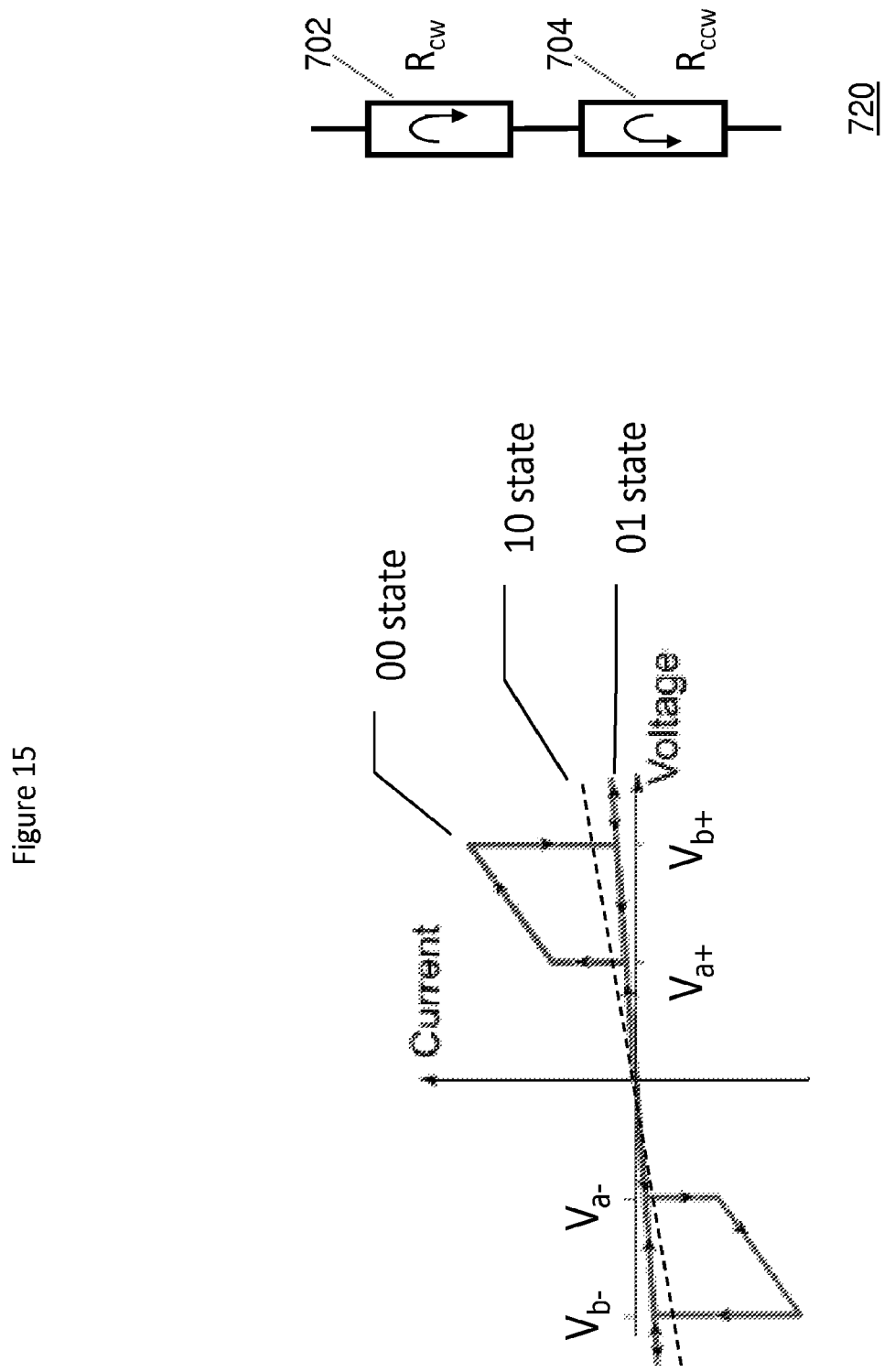
FIG. 15 illustrates creating asymmetry in the device to eliminate the need for resetting the device.

The above discussions are base on two identical heterojunction oxide resistors. If the HRS states of the two switching resistors 702 and 704 have sizable differences as illustrated in FIG. 15, than it is possible to perform a nondestructive read of a back-to-back resistor device. By so doing, we can eliminate the need for resetting the device after the read.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A switching device comprising:
    a first memory device characterized by a clockwise current to a voltage hysteresis loop; and
    a second memory device coupled to the first memory device, wherein the second memory device switching resistor; wherein the second switching resistor is characterized by a counter clock wise current to the voltage hysteresis loop,
    wherein the first memory device comprises: a first metal layer; a first metal oxide layer coupled to the first metal layer; a second metal oxide layer coupled to the first metal oxide layer; and a second metal layer coupled to the second metal oxide layer.

2. The switching device of claim 1, wherein a Gibbs free energy for the formation of the first metal oxide layer is lower than the Gibbs free energy for the formation of the second metal oxide layer.

3. The switching device of claim 1, wherein the first metal oxide comprises one of: $TiO_2$, $Ta_2O_3$, NiO, $WO_3$, or $Al_2O_3$, and the second metal oxide layer comprises Praseodymium Calcium Manganese Oxide (PCMO).

4. The switching device of claim 1, wherein the first metal oxide comprises a first switchable resistance and the second metal oxide comprises a second switchable resistance.

5. The switching device of claim 1, wherein the first metal oxide layer is characterized by a first high resistance and a first low resistance and the second metal oxide layer is characterized by a second high resistance and a second low resistance and wherein the first high resistance of the first metal oxide layer is greater than the second high resistance of the second metal oxide layer and the first low resistance of the first metal oxide is substantially similar to the second high resistance of the second metal oxide layer.

6. The switching device of claim 1, wherein the first memory device is characterized by a first state having a first resistance and a second state having a second resistance and the second memory device is characterized by a third state having a third resistance state and a fourth state having a fourth resistance, and wherein the first resistance is higher than the second resistance and the third resistance is higher than the fourth resistance.

7. The switching device of claim 1, wherein the clockwise voltage hysteresis loop of the first memory device and the counter-clockwise voltage hysteresis loop of the second memory device are asymmetric in magnitude.

8. The switching device of claim 2, wherein a metal in the first metal oxide layer is different from a metal in the first metal layer.

9. The switching device of claim 6, wherein it can be identified whether the first memory device is in the first or the second state by performing a non destructive read.

10. The switching device of claim 6, wherein it can be identified whether the second memory device is in the third or the fourth state by performing a non destructive read.

11. The switching device of claim 6, wherein the first resistance is substantially different from the third resistance.

12. The switching device of claim 6, wherein the second resistance is substantially different from the forth resistance.

* * * * *